United States Patent
Xiao

(10) Patent No.: US 9,209,289 B2
(45) Date of Patent: Dec. 8, 2015

(54) SEMICONDUCTOR DEVICE AND FABRICATION METHOD THEREOF

(71) Applicant: SEMICONDUCTOR MANUFACTURING INTERNATIONAL (SHANGHAI) CORPORATION, Shanghai (CN)

(72) Inventor: De Yuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/264,529

(22) Filed: Apr. 29, 2014

(65) Prior Publication Data
US 2015/0034905 A1    Feb. 5, 2015

(30) Foreign Application Priority Data

Jul. 31, 2013 (CN) .......................... 2013 1 0327029

(51) Int. Cl.
| | | |
|---|---|---|
| H01L 29/772 | (2006.01) |
| H01L 29/778 | (2006.01) |
| H01L 29/66 | (2006.01) |
| H01L 29/423 | (2006.01) |
| H01L 29/12 | (2006.01) |
| H01L 29/775 | (2006.01) |
| H01L 29/06 | (2006.01) |

(52) U.S. Cl.
CPC ............ H01L 29/778 (2013.01); H01L 29/122 (2013.01); H01L 29/42364 (2013.01); H01L 29/42376 (2013.01); H01L 29/66431 (2013.01); H01L 29/66462 (2013.01); H01L 29/7782 (2013.01); H01L 29/7789 (2013.01); *H01L 29/0673* (2013.01); *H01L 29/775* (2013.01)

(58) Field of Classification Search
CPC ............ H01L 29/66795; H01L 29/785; H01L 29/7851; H01L 29/1054
USPC ................................ 257/24, 12, 14, 192, 194
See application file for complete search history.

(56) References Cited

U.S. PATENT DOCUMENTS 7,767,560 B2 *  8/2010  Jin et al. ......................... 438/494
8,575,653 B2 * 11/2013  Rachmady et al. ........... 257/192

* cited by examiner

*Primary Examiner* — Whitney T Moore
*Assistant Examiner* — Scott Stowe
(74) *Attorney, Agent, or Firm* — Innovation Counsel LLP

(57) ABSTRACT

A method of fabricating a semiconductor device is provided. The method includes forming a substrate structure, wherein the substrate structure includes a substrate and a fin-shaped barrier layer formed on a surface of the substrate; forming a quantum well (QW) material layer on a surface of the fin-shaped barrier layer; and forming a barrier material layer on the QW material layer.

20 Claims, 10 Drawing Sheets

SEMICONDUCTOR DEVICE AND FABRICATION METHOD THEREOF

CROSS-REFERENCE TO RELATED APPLICATIONS

This application claims priority to Chinese Patent Application No. 201310327029.6 filed on Jul. 31, 2013 entitled "SEMICONDUCTOR DEVICE AND FABRICATION METHOD THEREOF", which is incorporated herein by reference in its entirety.

TECHNICAL FIELD

The present disclosure relates to the field of semiconductors, and more particularly, to a semiconductor device and method of fabricating the semiconductor device.

DESCRIPTION OF THE RELATED ART

A High Electron Mobility Transistor (HEMT) typically includes a modulation-doped heterojunction and a corresponding source-drain structure. The modulation-doped heterojunction forms a quantum well in which electrons can move quickly without colliding with impurities (unlike conventionally-doped MOSFETs). Effectively, a layer (called a Two-Dimensional Electron Gas (2-DEG)) is created in the heterojunction of the HEMT. The 2-DEG has high electron mobility and is not substantially affected by the scattering of ionized impurity ions. As a result, HEMT devices have attracted much attention in recent years.

Due to reductions in device size, HEMT devices incorporating Ultra-Thin Body (UTB) structures (such as Quantum Wells (QW)) have been proposed. In particular, short-channel effects resulting from the continuous down-scaling of Metal Oxide Semiconductor (MOS) transistors can be mitigated using planar QW transistors.

To further mitigate the short-channel effects, non-planar QW transistors may be used instead of planar QW transistors. However, existing non-planar QW transistors are prone to electron overflow, which could impact device performance.

SUMMARY

The present disclosure is directed to address at least the above problems relating to existing QW transistors in HEMT devices.

According to some embodiments of the inventive concept, a method of fabricating a semiconductor device is provided. The method includes forming a substrate structure, wherein the substrate structure includes a substrate and a fin-shaped barrier layer formed on a surface of the substrate; forming a quantum well (QW) material layer on a surface of the fin-shaped barrier layer; and forming a barrier material layer on the QW material layer.

In some embodiments, an insulating part may be formed adjacent to the fin-shaped barrier layer on the surface of the substrate, and forming the QW material layer on the surface of the fin-shaped barrier layer may further include forming the QW material layer on a portion of the surface of the fin-shaped barrier layer that is not covered by the insulating part.

In some embodiments, the method may further include forming a gate structure, wherein the gate structure may include a gate insulating layer formed on a portion of the barrier material layer and a portion of the insulating part, a gate formed on the gate insulating layer, and a spacer formed on opposite sides of the gate.

In some embodiments, the method may further include etching, using the gate structure as a mask, until a portion of the fin-shaped barrier layer is exposed; forming an undercut in the QW material layer and the barrier material layer under the gate structure, so as to increase an area of the exposed portion of the fin-shaped barrier layer; and depositing a semiconductor material on the exposed portion of the fin-shaped barrier layer to form a source region and a drain region.

In some embodiments, the method may further include forming a gate structure, wherein the gate structure may include a gate insulating layer formed on at least a portion of the barrier material layer, a gate formed on the gate insulating layer, and a spacer formed on opposite sides of the gate.

In some embodiments, the method may further include etching, using the gate structure as a mask, until a portion of the fin-shaped barrier layer is exposed; forming an undercut in the QW material layer and the barrier material layer under the gate structure, so as to increase an area of the exposed portion of the fin-shaped barrier layer; and depositing a semiconductor material on the exposed portion of the fin-shaped barrier layer to form a source region and a drain region.

In some embodiments, the substrate may include a base layer, a first buffer layer formed on the base layer, and a second buffer layer formed on the first buffer layer; and forming the substrate structure may further include forming the first buffer layer on a surface of the base layer, forming the second buffer layer on a surface of the first buffer layer, forming a barrier layer on a surface of the second buffer layer, and patterning the barrier layer to form the fin-shaped barrier layer, wherein the first buffer layer may include SiGe or GaAs, and the second buffer layer may include AlAs.

In some embodiments, the base layer may include Si.

In some embodiments, the fin-shaped barrier layer may include InAlAs, the QW material layer may include InGaAs, and the barrier material layer may include InP.

In some embodiments, the fin-shaped barrier layer may have a thickness ranging from about 10 nm to about 500 nm, the QW material layer may have a thickness ranging from about 10 nm to about 100 nm, and the barrier material layer may have a thickness ranging from about 10 nm to about 100 nm.

According to some other embodiments of the inventive concept, a semiconductor device is provided. The semiconductor device includes a substrate, a fin-shaped barrier layer formed on a surface of the substrate, a quantum well (QW) material layer formed on a surface of the fin-shaped barrier layer, and a barrier material layer formed on the QW material layer.

In some embodiments, the semiconductor device may further include an insulating part formed adjacent to the fin-shaped barrier layer on the surface of the substrate, and wherein the QW material layer may be formed on a portion of the surface of the fin-shaped barrier layer that is not covered by the insulating part.

In some embodiments, the semiconductor device may further include a gate structure comprising a gate insulating layer formed on a portion of the barrier material layer and a portion of the insulating part, a gate formed on the gate insulating layer, and a spacer formed on opposite sides of the gate.

In some embodiments, the semiconductor device may further include a source region and a drain region formed on an exposed portion of the fin-shaped barrier layer.

In some embodiments, the semiconductor device may further include a gate structure comprising a gate insulating layer formed on at least a portion of the barrier material layer, a gate formed on the gate insulating layer, and a spacer formed on opposite sides the gate.

In some embodiments, the semiconductor device may further include a source region and a drain region formed on an exposed portion of the fin-shaped barrier layer.

In some embodiments, the substrate may include a base layer, a first buffer layer formed on a surface of the base layer, a second buffer layer formed on a surface of the first buffer layer, wherein the first buffer layer may include SiGe or GaAs, and the second buffer layer may include AlAs.

In some embodiments, the base layer may include Si.

In some embodiments, the fin-shaped barrier layer may include InAlAs, the QW material layer may include InGaAs, and the barrier material layer may include InP.

In some embodiments, the fin-shaped barrier layer may have a thickness ranging from about 10 nm to about 500 nm; the QW material layer may have a thickness ranging from about 10 nm to about 100 nm; and the barrier material layer may have a thickness ranging from about 10 nm to about 100 nm.

BRIEF DESCRIPTION OF THE DRAWINGS

The accompanying drawings, which are incorporated in and constitute a part of the specification, illustrate different embodiments of the inventive concept and, together with the detailed description, serve to explain more clearly the inventive concept.

DETAILED DESCRIPTION

Various embodiments of the inventive concept are next described with reference to the accompanying drawings. It is noted that the following description of the different embodiments is merely illustrative in nature, and is not intended to limit the inventive concept, its application, or use. Also, the relative arrangement of the components and steps, and the numerical expressions and numerical values set forth in these embodiments do not limit the scope of the inventive concept unless specifically stated otherwise.

It is noted that in the accompanying drawings, for convenience of description, the dimensions of the components shown may not be drawn to scale. Also, same or similar reference numbers between different drawings represent the same or similar components.

Techniques, methods, and apparatus known by those of ordinary skill in the relevant art may not necessarily be described in detail. However, it should be appreciated that techniques, methods, and apparatus known to those skilled in the art are intended to be part of the specification where appropriate.

In the embodiments described herein, any specific values are illustrative and non-limiting. Accordingly, other examples and embodiments of the inventive concept may have different values.

Figure 1:
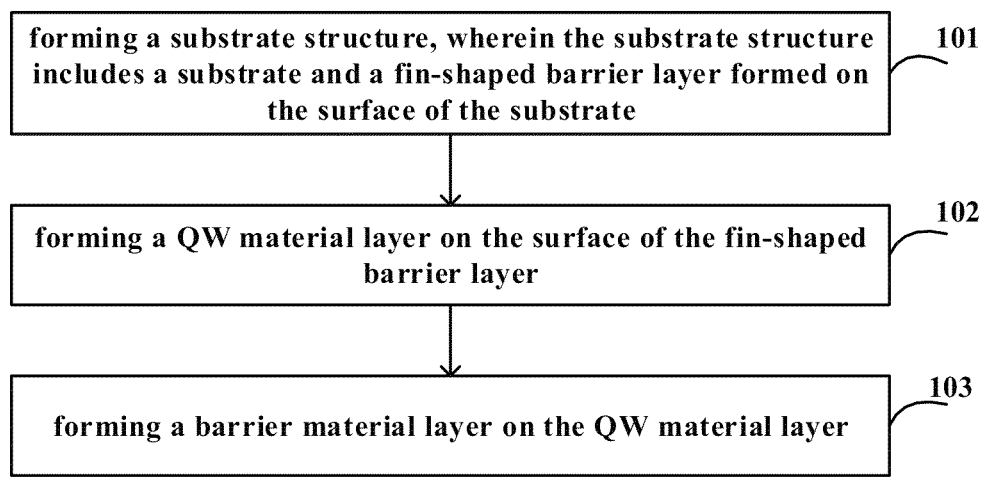
FIG. 1 is a flowchart of a method of fabricating a semiconductor device according to an embodiment of the inventive concept.

FIG. 1 is a flowchart of a method of fabricating a semiconductor device according to an embodiment of the inventive concept. Referring to FIG. 1, a substrate structure is formed (Step 101). The substrate structure includes a substrate, and a fin-shaped barrier layer formed on a surface of the substrate.

In some embodiments, the substrate may include a base layer, a first buffer layer formed on the base layer, and a second buffer layer formed on the first buffer layer. Accordingly, in those embodiments, forming the substrate structure (Step 101) may include: forming the first buffer layer on a surface of the base layer, forming the second buffer layer on a surface of the first buffer layer, forming a barrier layer on a surface of the second buffer layer, and patterning the barrier layer to form the fin-shaped barrier layer.

In some embodiments, the first buffer layer may include SiGe or GaAs, and the second buffer layer may include AlAs. In some embodiments, a thickness of each of the first and second buffer layers may range from about 10 nm to about 500 nm. In some embodiments, the base layer may include Si. For example, in embodiments in which the first buffer layer is formed including SiGe or GaAs and the second buffer layer is formed including AlAs, the base layer is preferably a <111> Si base (i.e. a Si base having the <111> crystal face as its primary surface).

In some other embodiments, the base layer may include, for example, a sapphire base or any other appropriate base material.

In some embodiments, the fin-shaped barrier layer may include InAlAs.

Next, a QW material layer is formed on a surface of the fin-shaped barrier layer (Step 102). In some embodiments, the QW material layer may include InGaAs. The QW material layer may be formed, for example, through selective epitaxy growth.

Next, a barrier material layer is formed on the QW material layer (Step 103). In some embodiments, the barrier material layer may include InP. The barrier material layer may be formed, for example, through selective epitaxy growth.

Accordingly, a semiconductor device (e.g. a HEMT device) having a non-planar (e.g. fin-shaped) QW structure may be formed using the exemplary method depicted in FIG. 1. A Two-Dimensional Electron Gas (2-DEG) layer is formed in the QW structure. Accordingly, the QW structure can mitigate short-channel effects, thereby enabling high carrier mobility in the semiconductor device.

In some embodiments, a gate structure may be further formed on the QW structure. The gate structure may include a gate insulating layer formed on the barrier material layer, a gate formed on the gate insulating layer, and a spacer formed on opposite sides of the gate. The aforementioned gate structure may be referred to as a first gate structure. The first gate structure may be formed using processes and materials that are known to those skilled in the art, and therefore a detailed description of those processes and materials shall be omitted.

In some embodiments, an insulating part may be formed adjacent to the fin-shaped barrier layer. In those embodiments, forming a QW material layer on a surface of the fin-shaped barrier layer (Step 102) may include forming the QW material layer on the surface of the fin-shaped barrier layer that is not covered by the insulating part. Thus, in those embodiments, the QW material layer is formed on the surface of the fin-shaped barrier layer that is not covered by the insulating part. Accordingly, in those embodiments, the gate structure may include a gate insulating layer formed on a portion of the barrier material layer and a portion of the insulating part, a gate formed on the gate insulating layer, and a spacer formed on opposite sides of the gate. The aforementioned gate structure may be referred to as a second gate structure.

It should be understood however, that the inventive concept is not limited to the above-described embodiments. For example, those skilled in the art may select appropriate materials for the buffer layers and the barrier layer (that are compatible with the QW material) to form the semiconductor structure in this disclosure.

In some embodiments, the fin-shaped barrier layer may have a thickness ranging from about 10 nm to about 500 nm; the QW material layer may have a thickness ranging from about 10 nm to about 100 nm; and the barrier material layer may have a thickness ranging from about 10 nm to about 100 nm. It should be understood that those numbers or numerical ranges are merely exemplary, and that the inventive concept is not limited thereto.

In some embodiments, after the gate structure has been formed, etching is performed using the gate structure as a mask, until a portion of the fin-shaped barrier layer is exposed. The QW material layer and the barrier material layer under the gate structure are etched having an undercut, so as to increase an area of the exposed portion of the fin-shaped barrier layer. Subsequently, a semiconductor material is grown on the exposed portion of the fin-shaped barrier layer to form a source region and a drain region. The undercut in the QW material layer and the barrier material layer under the gate structure can aid in the epitaxy growth of the source region and the drain region.

FIGS. 2 to 12 depict cross-sectional views of a semiconductor device at different stages of fabrication according to an embodiment of the inventive concept. In particular, FIGS. 2, 3a, 4a, 5a, 6a, 7a, 8a, and 9a illustrate cross-sectional views of the resulting structure perpendicular to the longitudinal direction of the fin (i.e. perpendicular to the channel direction), and FIGS. 3b, 4b, 5b, 6b, 7b, 8b, 9b, 10, 11, and 12 illustrate cross-sectional views of the resulting structure along the longitudinal direction of the fin (i.e. along the channel direction), at different stages of fabrication.

Figure 2:
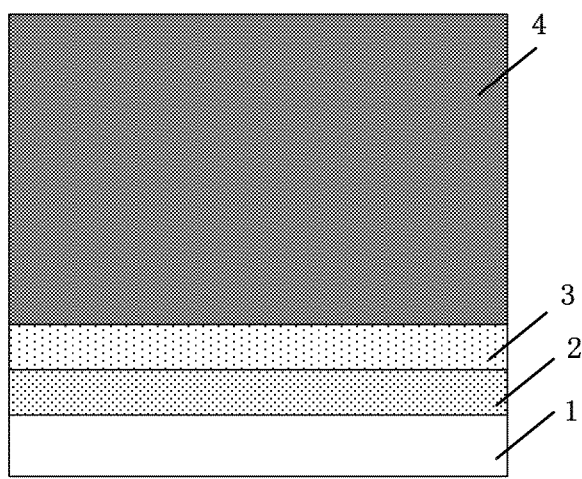
FIGS. 2 to 12 depict cross-sectional views of a semiconductor device at different stages of fabrication according to an embodiment of the inventive concept.

First, as shown in FIG. 2, a first buffer layer 2, a second buffer layer 3, and a barrier layer 4 are sequentially formed on a base layer 1 through, for example, MOCVD (Metal-Organic Chemical Vapor Deposition), ALD (Atomic Layer Deposition), MBE (Molecular Beam Epitaxy), or other similar deposition techniques. The base layer 1, the first buffer layer 2, and the second buffer layer 3 collectively constitute a substrate. In some embodiments, the base layer 1 may include Si having <111> orientation as its primary surface crystal orientation. In some embodiments, the first buffer layer 2 may include SiGe or GaAs, the second buffer layer 3 may include AlAs, and the barrier layer 4 may include InAlAs. In some embodiments, a thickness of each of the first buffer layer and the second buffer layer may range from about 10 nm to about 500 nm.

Figure 3A:
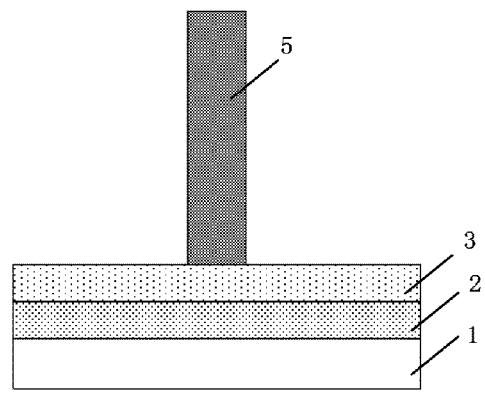
Figure 3B:
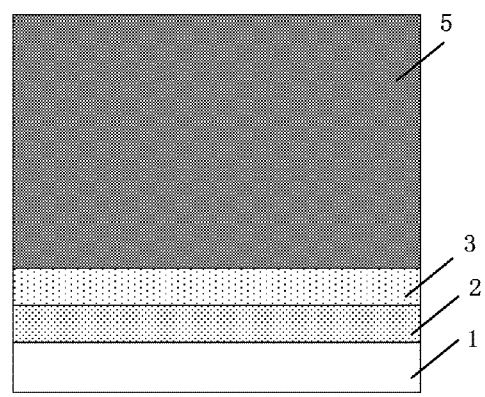

Next, as shown in FIGS. 3a and 3b, the barrier layer 4 is patterned to form a fin-shaped barrier layer 5 on the second buffer layer 3. The barrier layer 4 may be patterned through, for example, lithography and dry etching.

Figure 4A:
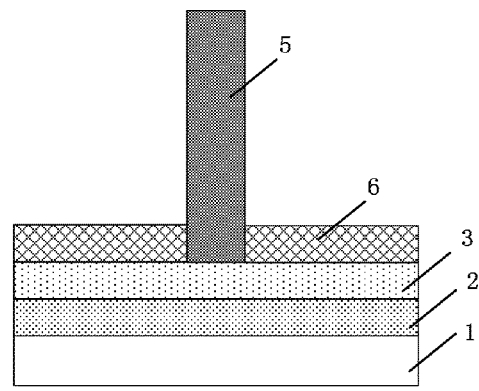
Figure 4B:
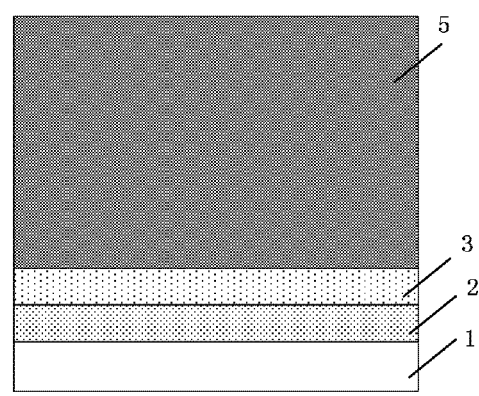

Next, as shown in FIGS. 4a and 4b, an insulating part 6 is formed on the surface of the second buffer layer 3. The insulating part 6 is formed adjacent to the fin-shaped barrier layer 5 (see FIG. 4a). In some embodiments, the insulating part 6 may include a $SiO_2$ layer having a thickness ranging from about 50 nm to about 500 nm. In some particular embodiments, the insulating layer may be omitted.

Figure 5A:
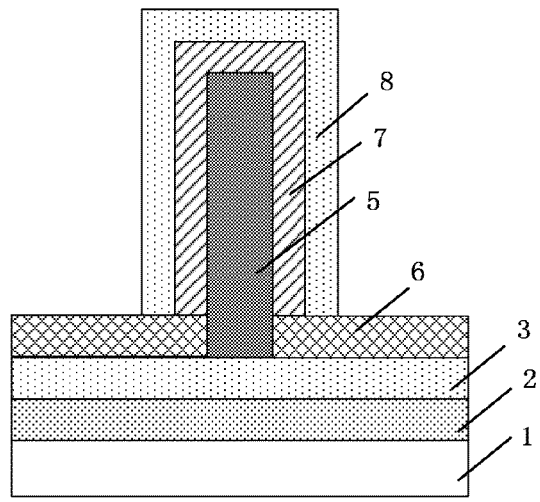
Figure 5B:
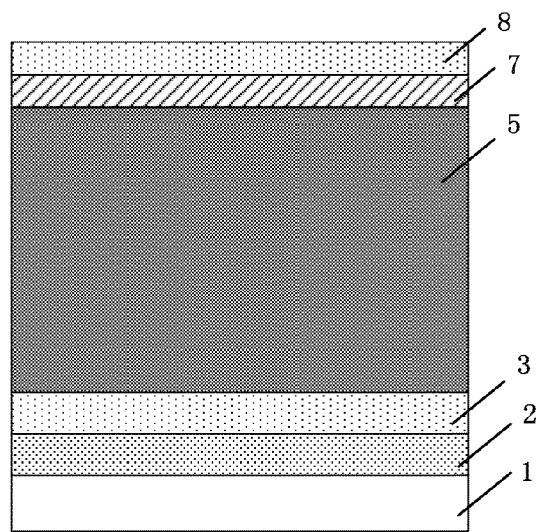

Next, as shown in FIGS. 5a and 5b, a QW material layer 7 is formed on the surface of the fin-shaped barrier layer 5, and a barrier material layer 8 is formed on the QW material layer 7. In some embodiments, the QW material 7 may include InGaAs and the barrier material may include InP. As previously described, the QW material layer 7 and the barrier material layer 8 may be formed through selective epitaxy growth.

In some embodiments, the fin-shaped barrier layer 5 may have a thickness ranging from about 10 nm to about 500 nm; the QW material layer 7 may have a thickness ranging from about 10 nm to about 100 nm; and the barrier material layer 8 may have a thickness ranging from about 10 nm to about 100 nm.

Figure 6A:
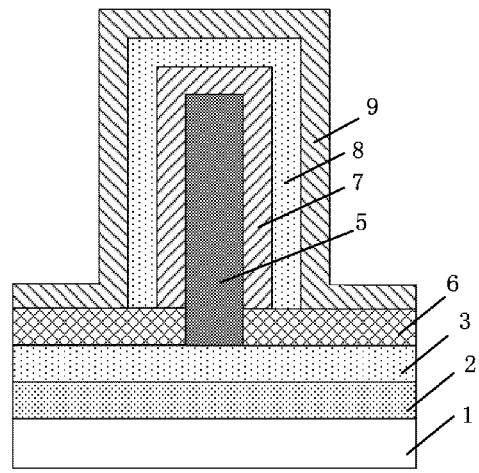
Figure 6B:
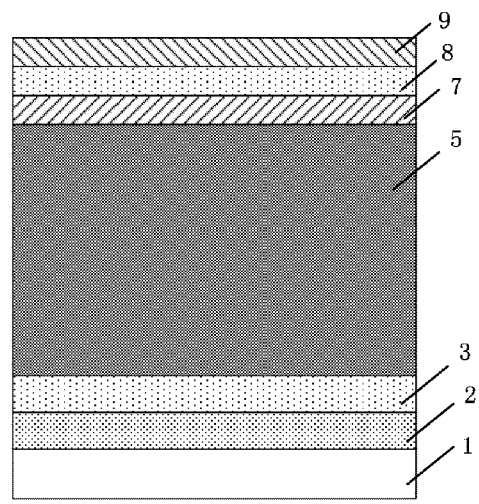

Next, as shown in FIGS. 6a and 6b, a gate insulating layer 9 is formed over the structure of FIGS. 5a and 5b, the gate insulating layer 9 covering at least a portion of the insulating part 6 and at least a portion of the barrier material layer 8. In some embodiments, the gate insulating layer 9 may include a high-K dielectric, for example, $Al_2O_3$, $TiSiO_x$, etc. In some embodiments, the gate insulating layer 9 may have a thickness ranging from about 1 nm to about 5 nm.

Figure 7A:
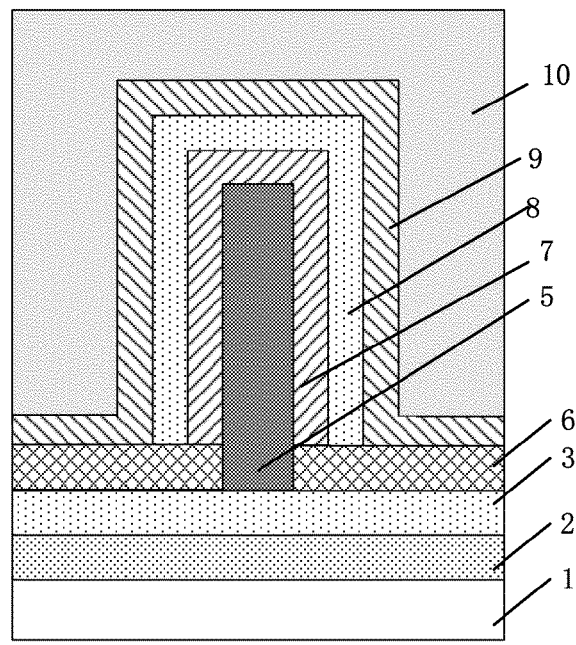
Figure 7B:
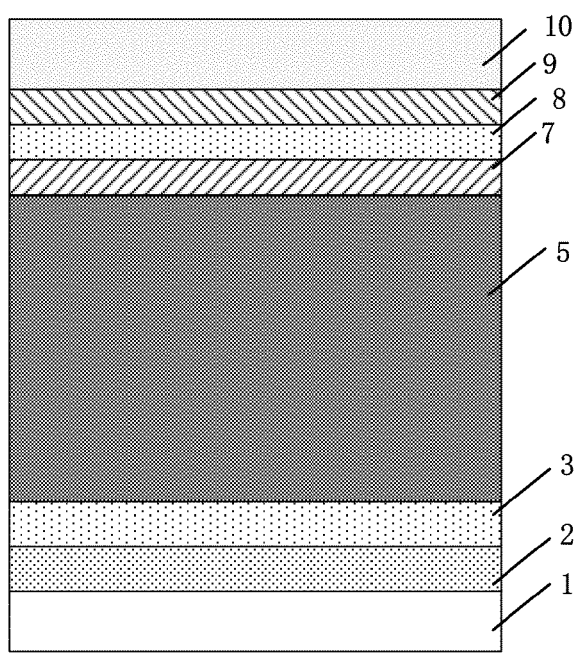

Next, as shown in FIGS. 7a and 7b, a gate material 10 is deposited on the gate insulating layer 9. The gate material 10 may be deposited through, for example, PVD, MOCVD, ALD, MBE, or other similar deposition techniques.

Figure 8A:
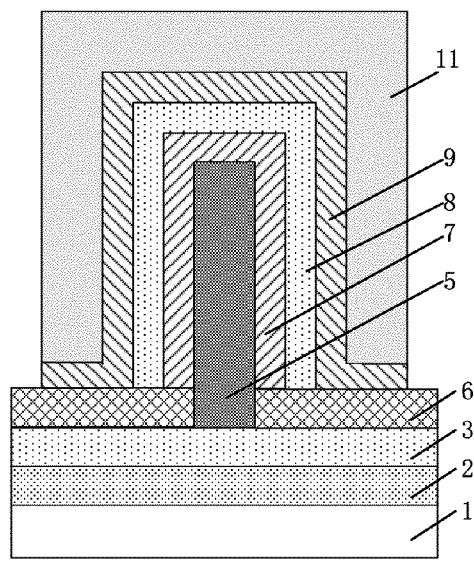
Figure 8B:
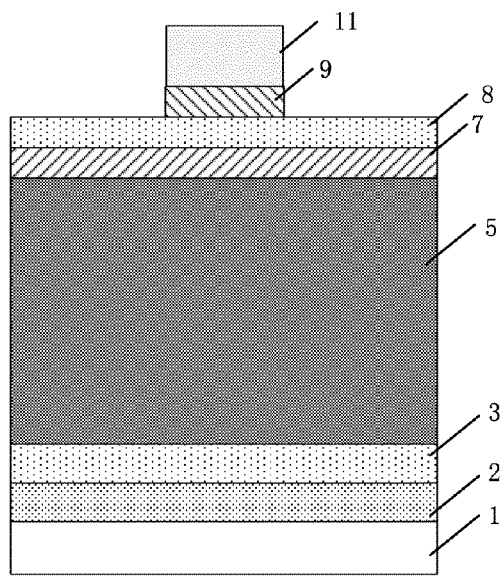

Next, as shown in FIGS. 8a and 8b, a gate 11 is formed by patterning the gate material 10. In some embodiments, the gate material 10 may include polysilicon, and as such the gate 11 may be a polysilicon gate or pseudo (dummy) gate. In other embodiments, the gate material 10 may include a metal or metal alloy (e.g. Ni—Au or Cr—Au), and as such the gate 11 may be a metal gate.

Figure 9A:
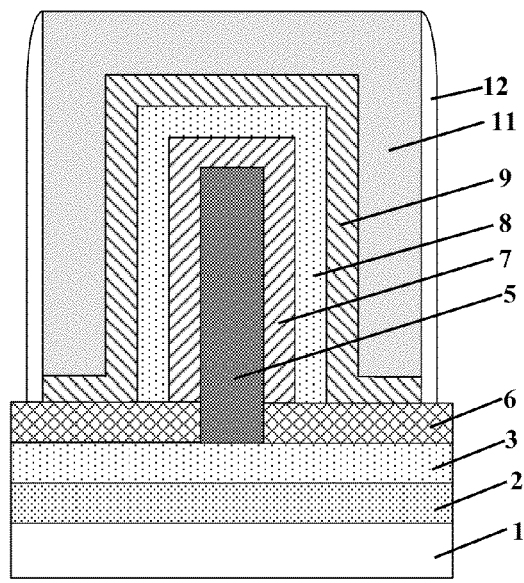
Figure 9B:
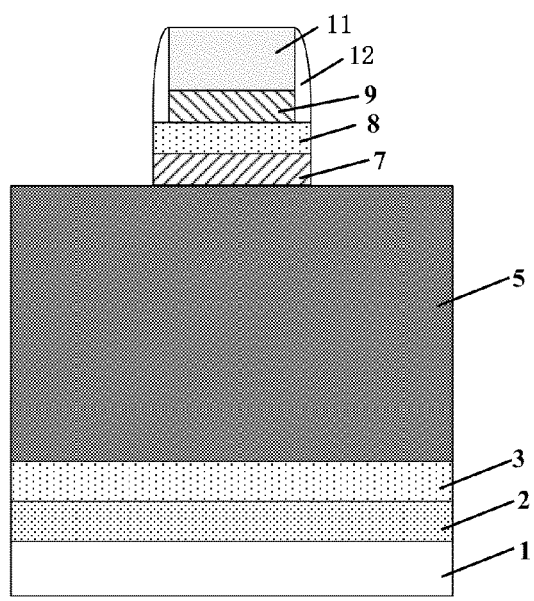

After the gate 11 has been formed, a spacer 12 is formed on opposite sides of the gate 11 (see FIGS. 9a and 9b). Etching is then performed using the gate 11 and the spacer 12 as a mask, until a portion of the fin-shaped barrier layer 5 is exposed.

Figure 10:
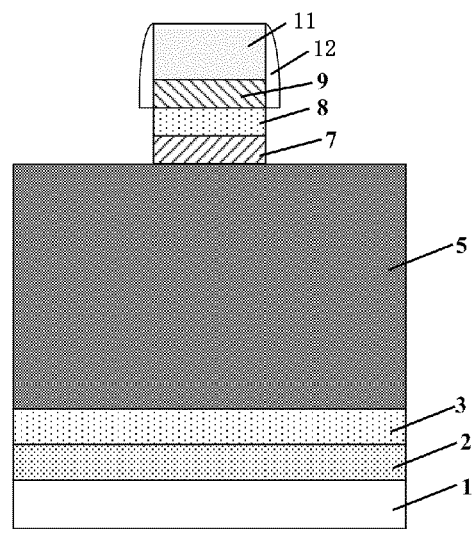

Next, as shown in FIG. 10, the QW material layer 7 and the barrier material layer 8 under the gate structure are etched having an undercut, so as to increase an area of the exposed portion of the fin-shaped barrier layer 5.

Figure 11:
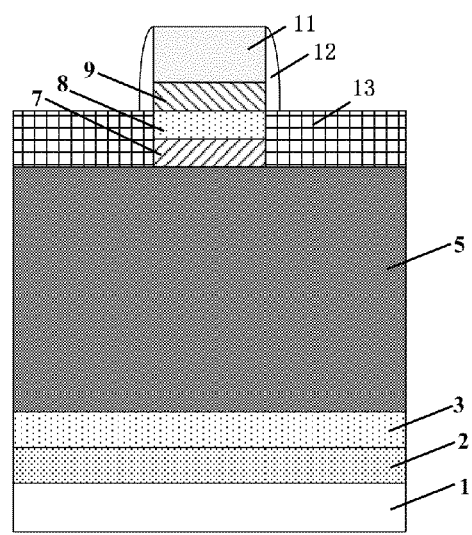

Next, as shown in FIG. 11, a semiconductor material is grown on the exposed portion of the fin-shaped barrier layer 5 to form a source region/drain region 13.

Figure 12:
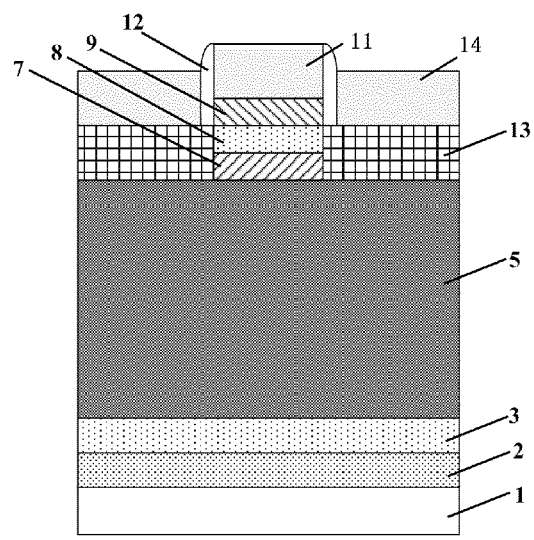

Next, as shown in FIG. 12, a source/drain 14 is formed in the corresponding source region/drain region 13.

Specifically, FIG. 12 illustrates a semiconductor device (e.g. a HEMT device) having a non-planar (e.g. fin-shaped) QW structure. A Two-Dimensional Electron Gas (2-DEG) layer is formed in the QW structure. Accordingly, the QW structure can mitigate short-channel effects, thereby enabling high carrier mobility in the semiconductor device.

It should be understood that the inventive concept is not limited to the embodiments described above. Those skilled in the art may appreciate that a polysilicon gate or pseudo (dummy) gate can be replaced by a metal gate in a subsequent step. For example, in some embodiments, the polysilicon gate or pseudo (dummy) gate may be removed after forming the source region and the drain region. Subsequently, a metal gate may be formed in place of the polysilicon gate or pseudo (dummy) gate.

A semiconductor device and method of fabricating the semiconductor device according to embodiments of the inventive concept have been described above. In order to avoid obscuring the inventive concept, details that are well-known in the art may have been omitted. Nevertheless, those skilled in the art would be able to understand the implementation of the inventive concept and its technical details in view of the present disclosure.

The embodiments of the inventive concept have been described with reference to the accompanying drawings. However, the embodiments are merely illustrative and do not limit the scope of the inventive concept. Furthermore, those skilled in the art would appreciate that various modifications can be made to the different embodiments without departing from the scope of the present disclosure.

What is claimed is:

1. A method of fabricating a semiconductor device, the method comprising:
    forming a substrate structure, wherein the substrate structure includes a substrate and a fin-shaped barrier layer formed on a surface of the substrate;
    forming an insulating part adjacent to the fin-shaped barrier layer on the surface of the substrate, wherein the surface of the substrate directly contacts each of the fin-shaped barrier and the insulating part and is parallel to a bottom side of the substrate;
    forming a quantum well (QW) material layer on a surface of the fin-shaped barrier layer; and
    forming a barrier material layer on the QW material layer.

2. The method according to claim 1, wherein the forming the QW material layer on the surface of the fin-shaped barrier layer comprises:
    forming the QW material layer on a portion of the surface of the fin-shaped barrier layer that is not covered by the insulating part.

3. The method according to claim 2, further comprising:
    forming a gate structure, wherein the gate structure includes a gate insulating layer formed on a portion of the barrier material layer and a portion of the insulating part, a gate formed on the gate insulating layer, and a spacer formed on opposite sides of the gate.

4. The method according to claim 3, further comprising:
    etching, using the gate structure as a mask, until a portion of the fin-shaped barrier layer is exposed;
    forming an undercut in the QW material layer and the barrier material layer under the gate structure, so as to increase an area of the exposed portion of the fin-shaped barrier layer; and
    depositing a semiconductor material on the exposed portion of the fin-shaped barrier layer to form a source region and a drain region.

5. The method according to claim 1, further comprising:
    forming a gate structure, wherein the gate structure includes a gate insulating layer formed on at least a portion of the barrier material layer, a gate formed on the gate insulating layer, and a spacer formed on opposite sides of the gate.

6. The method according to claim 5, further comprising:
    etching, using the gate structure as a mask, until a portion of the fin-shaped barrier layer is exposed;
    forming an undercut in the QW material layer and the barrier material layer under the gate structure, so as to increase an area of the exposed portion of the fin-shaped barrier layer; and
    depositing a semiconductor material on the exposed portion of the fin-shaped barrier layer to form a source region and a drain region.

7. The method according to claim 1, wherein the substrate includes a base layer and at least one buffer layer formed on the base layer, wherein the at least one buffer layer comprises a first buffer layer formed on the base layer and a second buffer layer formed on the first buffer layer, and wherein the forming the substrate structure comprises:
    forming the first buffer layer on a surface of the base layer,
    forming the second buffer layer on a surface of the first buffer layer,
    forming a barrier layer on a surface of the second buffer layer, and
    patterning the barrier layer to form the fin-shaped barrier layer,
    wherein the first buffer layer includes SiGe or GaAs, and the second buffer layer includes AlAs.

8. The method according to claim 7, wherein the base layer includes Si.

9. The method according to claim 1, wherein the fin-shaped barrier layer includes InAlAs, the QW material layer includes InGaAs, and the barrier material layer includes InP.

10. The method according to claim 1, wherein:
    the fin-shaped barrier layer has a thickness ranging from about 10 nm to about 500 nm,
    the QW material layer has a thickness ranging from about 10 nm to about 100 nm, and
    the barrier material layer has a thickness ranging from about 10 nm to about 100 nm.

11. A semiconductor device, comprising:
    a substrate;
    a fin-shaped barrier layer directly contacting a surface of the substrate, wherein the surface of the substrate is parallel to a side of the substrate;
    an insulating part formed adjacent to the fin-shaped barrier layer and directly contacting the surface of the substrate;
    a quantum well (QW) material layer formed on a surface of the fin-shaped barrier layer; and
    a barrier material layer formed on the QW material layer.

12. The semiconductor device according to claim 11, further comprising: a gate structure comprising a gate insulating layer formed on a portion of the barrier material layer and a portion of the insulating part, a gate formed on the gate insulating layer, and a spacer formed on opposite sides of the gate.

13. The semiconductor device according to claim 12, further comprising: a source region and a drain region formed on an exposed portion of the fin-shaped barrier layer.

14. The semiconductor device according to claim 11, further comprising: a gate structure comprising a gate insulating layer formed on at least a portion of the barrier material layer, a gate formed on the gate insulating layer, and a spacer formed on opposite sides the gate.

15. The semiconductor device according to claim 14, further comprising: a source region and a drain region formed on an exposed portion of the fin-shaped barrier layer.

16. The semiconductor device according to claim 11,
    wherein the substrate includes a base layer and at least one buffer layer formed on the base layer,
    wherein the at least one buffer layer comprises a first buffer layer formed on a surface of the base layer and comprises a second buffer layer formed on a surface of the first buffer layer, and
    wherein the first buffer layer includes SiGe or GaAs, and the second buffer layer includes AlAs.

17. The semiconductor device according to claim 16, wherein the base layer includes Si.

18. The semiconductor device according to claim 11, wherein the fin-shaped barrier layer includes InAlAs, the QW material layer includes InGaAs, and the barrier material layer includes InP.

19. The semiconductor device according to claim 11, wherein:
    the fin-shaped barrier layer has a thickness ranging from about 10 nm to about 500 nm;
    the QW material layer has a thickness ranging from about 10 nm to about 100 nm; and
    the barrier material layer has a thickness ranging from about 10 nm to about 100 nm.

20. A method of fabricating a semiconductor device, the method comprising:
    forming a substrate;

forming a fin-shaped barrier layer on the substrate;
forming a quantum well (QW) material layer on the fin-shaped barrier layer;
forming a barrier material layer on the QW material layer;
forming a gate structure on the barrier material layer;
etching, using the gate structure as a mask, until a portion of the fin-shaped barrier layer is exposed;
forming an undercut in the QW material layer under the gate structure; and
depositing a semiconductor material on the portion of the fin-shaped barrier layer.

* * * * *